US012805237B2

(12) United States Patent
Sasa et al.

(10) Patent No.: US 12,805,237 B2
(45) Date of Patent: Nov. 17, 2026

(54) LIQUID SUPPLY SYSTEM

(71) Applicant: Samsung Electronics Co., Ltd., Suwon-si (KR)

(72) Inventors: Takashi Sasa, Suwon-si (KR); Kyoungwhan Oh, Suwon-si (KR); Hokyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 547 days.

(21) Appl. No.: 18/358,160

(22) Filed: Jul. 25, 2023

(65) Prior Publication Data

US 2024/0105469 A1 Mar. 28, 2024

(30) Foreign Application Priority Data

Sep. 27, 2022 (KR) ........................ 10-2022-0122049

(51) Int. Cl.
*H10P 72/00* (2026.01)
*B01D 19/00* (2006.01)

(52) U.S. Cl.
CPC ...... *H10P 72/0404* (2026.01); *B01D 19/0031* (2013.01); *B01D 19/0063* (2013.01); *B01D 19/0068* (2013.01)

(58) Field of Classification Search
CPC ............. H10P 72/0404; H10P 72/0402; B01D 19/0031; B01D 19/0063; B01D 19/0068; B01D 19/0073; B01D 35/02
See application file for complete search history.

(56) References Cited

U.S. PATENT DOCUMENTS 7,029,238 B1 * 4/2006 Zagars .................... F04B 43/02 222/189.06
7,806,668 B2 10/2010 Yajima
8,256,569 B1 * 9/2012 Huff ........................ F01N 1/026 181/252
9,246,311 B1 1/2016 Raring et al.
9,731,226 B2 * 8/2017 Yoshihara .......... B01D 19/0063
10,134,981 B1 11/2018 Yang et al.
(Continued)

FOREIGN PATENT DOCUMENTS

JP H08226384 A * 9/1996
JP 2012071230 A 4/2012
(Continued)

OTHER PUBLICATIONS

Translation of JP-H08226384-A, accessed Feb. 25, 2026 (Year: 1996).*

*Primary Examiner* — Jennifer Dieterle
*Assistant Examiner* — Phillip Y Shao
(74) *Attorney, Agent, or Firm* — Wolf, Greenfield & Sacks, P.C.

(57) ABSTRACT

A liquid supply system includes a liquid supply unit; a liquid pressurizer connected to the liquid supply unit; a compressor connected to the liquid pressurizer; a pump at a rear end of the liquid pressurizer to allow liquid to flow; an inflow control valve between the liquid supply unit and the liquid pressurizer; and an outflow control valve between the liquid pressurizer and the pump, wherein the liquid pressurizer is configured to supply liquid having a dissolved gas concentration that is lower than a dissolved gas concentration of liquid supplied from the liquid supply unit to the pump.

20 Claims, 9 Drawing Sheets

(56) References Cited

U.S. PATENT DOCUMENTS

| | | | | |
|---|---|---|---|---|
| 10,403,501 | B2 | 9/2019 | Devilliers et al. | |
| 11,333,142 | B2 | 5/2022 | Ishimaru et al. | |
| 2005/0092594 | A1* | 5/2005 | Parro | F25J 3/0233 203/100 |
| 2014/0017414 | A1 | 1/2014 | Fukazawa et al. | |
| 2014/0260963 | A1* | 9/2014 | Wang | B01D 19/0031 96/219 |
| 2014/0264658 | A1 | 9/2014 | Gogoi | |
| 2014/0268523 | A1 | 9/2014 | Gogoi | |
| 2015/0209818 | A1 | 7/2015 | Devilliers et al. | |
| 2015/0328649 | A1* | 11/2015 | Carcasi | G03F 7/16 222/134 |
| 2016/0165731 | A1 | 6/2016 | Hurwitz et al. | |
| 2016/0167953 | A1 | 6/2016 | Gogoi | |
| 2016/0167954 | A1 | 6/2016 | Gogoi | |
| 2016/0379824 | A1 | 12/2016 | Wise et al. | |
| 2017/0043287 | A1* | 2/2017 | Marumoto | H10P 72/0402 |
| 2018/0065065 | A1* | 3/2018 | Sasa | F04B 43/02 |
| 2019/0076763 | A1* | 3/2019 | Ichino | B01D 36/001 |
| 2019/0146336 | A1 | 5/2019 | Chen et al. | |
| 2020/0163487 | A1* | 5/2020 | Kihara | G07F 13/00 |
| 2022/0195840 | A1 | 6/2022 | El Mallawany et al. | |

FOREIGN PATENT DOCUMENTS

| | | | |
|---|---|---|---|
| JP | 7042639 | B2 | 3/2022 |
| KR | 10-0780936 | B1 | 12/2007 |
| KR | 10-2018-0022573 | A | 3/2018 |
| KR | 10-2021-0145555 | A | 12/2021 |
| KR | 10-2022-0094427 | A | 7/2022 |

* cited by examiner

LIQUID SUPPLY SYSTEM

CROSS-REFERENCE TO RELATED APPLICATION(S)

This application claims benefit of priority to Korean Patent Application No. 10-2022-0122049 filed on Sep. 27, 2022, in the Korean Intellectual Property Office, the disclosure of which is incorporated herein by reference in its entirety.

BACKGROUND

The present inventive concept relates to a liquid supply system.

A semiconductor may be manufactured using several processes. For example, a semiconductor may be manufactured using an exposure process, a deposition process, an etching process, and the like. Various processes, in addition thereto, may be applied. In these various processes, a variety of materials may be used. Materials used in semiconductor processing may be delivered in a liquid state. The liquid may be supplied to semiconductor equipment through a tube, a pipe, or the like.

Meanwhile, when a length of the pipe is long, a gas bubble may be generated due to a change in pressure of liquid. Accordingly, the generated gas bubble should be removed to maintain cleanliness of the liquid, so that a product defect may be reduced.

SUMMARY

An aspect of the present inventive concept is to provide a liquid supply system supplying liquid to a process by removing a gas bubble to maintain cleanliness of the liquid.

According to an aspect of the present inventive concept, a liquid supply system includes a liquid supply unit; a liquid pressurizer connected to the liquid supply unit; a compressor connected to the liquid pressurizer; a pump connected to the liquid pressurizer and configured to drive a flow of liquid from the liquid pressurizer; an inflow control valve between the liquid supply unit and the liquid pressurizer; and an outflow control valve between the liquid pressurizer and the pump, wherein the liquid pressurizer is configured to supply liquid having a dissolved gas concentration that is lower than a dissolved gas concentration of liquid supplied from the liquid supply unit.

According to an aspect of the present inventive concept, liquid supply system comprising includes a liquid supply unit; a liquid pressurizer configured to receive liquid from the liquid supply unit; a compressor configured to control a pressure of liquid in the liquid pressurizer; a pump connected to the liquid pressurizer and configured to control a flow of liquid from the liquid pressurizer, wherein the pump comprises a filter configured to remove gas bubbles or impurities from liquid in the pump; an inflow control valve between the liquid supply unit and the liquid pressurizer; and an outflow control valve between the liquid pressurizer and the pump, wherein the liquid pressurizer is configured to supply liquid having a dissolved gas concentration that is lower than a dissolved gas concentration of liquid supplied from the liquid supply unit; and wherein the pump is configured to pass liquid through the filter at a pressure that is higher than a pressure of liquid supplied from the liquid pressurizer to the pump such that liquid is absorbed into the filter to thereby remove gas bubble or impurities from liquid supplied from the liquid pressurizer.

According to an aspect of the present inventive concept, a method of driving a liquid supply system comprising: supplying liquid to a liquid pressurizer; generating a gas from gas bubbles in liquid in the liquid pressurizer; discharging the gas through a first drain line from the liquid pressurizer; supplying liquid having a low dissolved gas concentration from the liquid pressurizer to a pump; passing liquid having the low dissolved gas concentration through a filter in the pump in a forward direction or a reverse direction; and removing gas bubbles in the filter by maintaining effective positive pressure in the filter to thereby perform additional moisture absorption of the filter.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the accompanying drawings.

Figure 1:
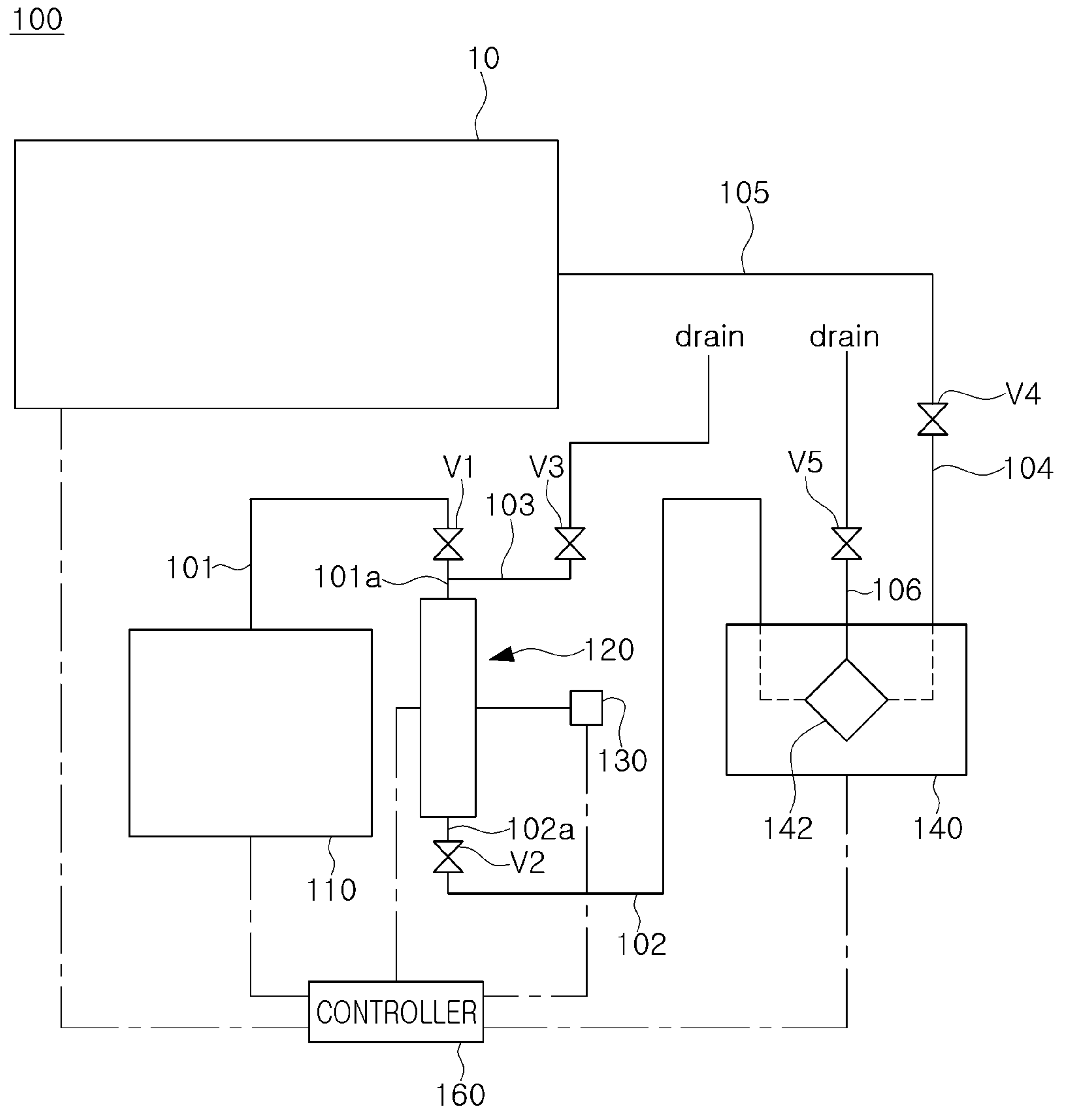
FIG. 1 is a configuration diagram illustrating a liquid supply system according to an example embodiment.

FIG. 1 is a configuration diagram illustrating a liquid supply system according to an example embodiment.

Referring to FIG. 1, a liquid supply system 100 according to an example embodiment may supply liquid or the like to semiconductor equipment 10. The semiconductor equipment 10 may include etching equipment and/or deposition equipment, or the like. The liquid supply system 100 may include a liquid supply unit 110, a liquid pressurizer 120, a compressor 130, and a pump 140.

The liquid supply unit 110 may supply liquid to the semiconductor equipment 10 via the liquid pressurizer 120 and the pump 140. As an example, the liquid supplied by the liquid supply unit 110 may be a photosensitive raw material (e.g., a photoresist). In this case, the semiconductor equipment 10 may be an exposure device. The present disclosure is not limited thereto, and the liquid supplied from the liquid supply unit 110 may be any one of various liquids used in semiconductor manufacturing processes, for example, in etching equipment and deposition equipment. The liquid supply unit 110 may be connected to the liquid pressurizer 120 through a first line 101. As an example, the liquid supplied from the liquid supply unit 110 may be introduced into the liquid pressurizer 120 through a first line 101, an inlet control valve V1, an inlet line 101*a*, or the like by pressure of the pump 140.

The liquid supply unit 110 may include two liquid reservoirs (not illustrated), and the two liquid reservoirs may be selectively used. Therefore, when one liquid reservoir of the two liquid reservoirs is maintained, repaired, or replaced, liquid may be supplied from the other liquid reservoir. Therefore, maintenance, repair, or replacement of the liquid reservoirs may be performed without interruption of a process.

Figure 2:
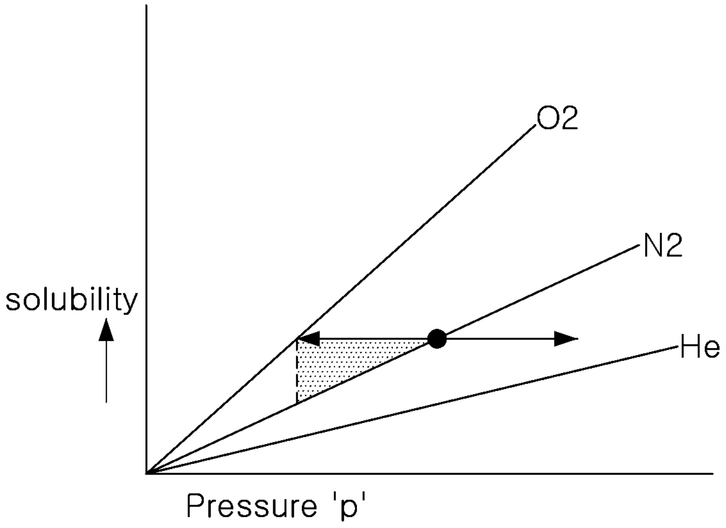
FIG. 2 is a graph illustrating Henry's law.
Figure 3:
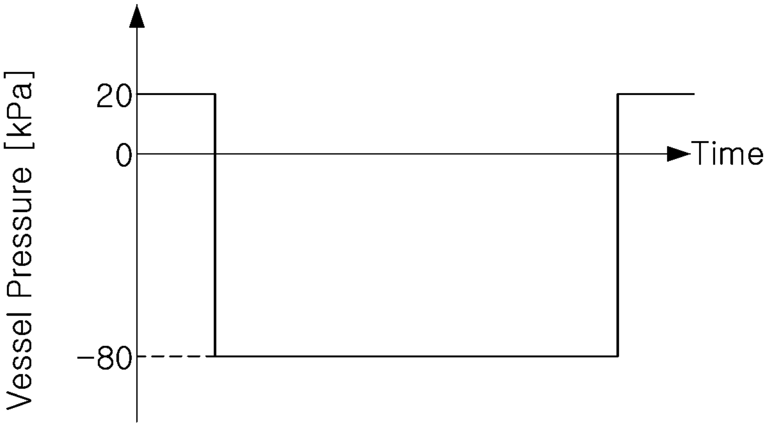
FIG. 3 is a graph illustrating negative pressure provided to a liquid pressurizer.
Figure 4:
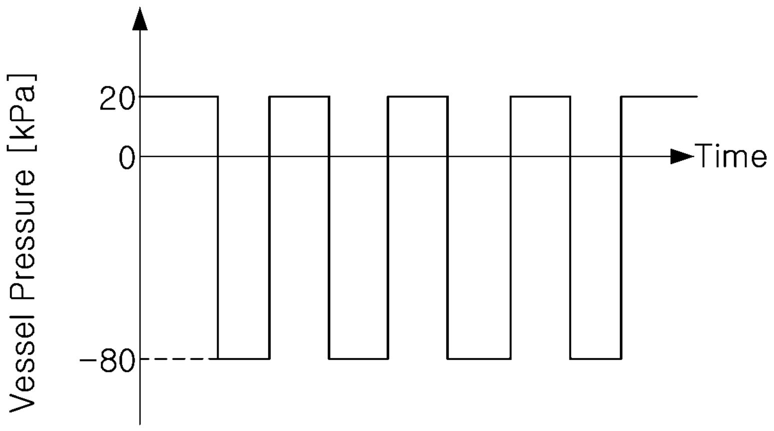
FIG. 4 is a graph illustrating pulse-type pressure provided to a liquid pressurizer.

The liquid pressurizer 120 may be connected to the liquid supply unit 110, and may receive liquid from the liquid supply unit 110. As an example, the liquid pressurizer 120 may be connected to the pump 140 or the like. For example, liquid discharged from the liquid pressurizer 120 may flow toward the pump 140 via an outlet line 102*a*, an outlet control valve V2, a second line 102, or the like. The liquid pressurizer 120 may increase or decrease pressure of the liquid to remove a gas bubble from the liquid. As an example, the liquid pressurizer 120 may receive positive pressure or negative pressure from the compressor 130 or the like to adjust the pressure of the liquid located in the liquid pressurizer 120. Through this, the liquid pressurizer 120 may adjust an amount of dissolved gas in the liquid. For example, generation of a gas bubble in the liquid by the liquid pressurizer 120 may be suppressed. For example, after opening the inlet control valve V1 to receive the liquid by the liquid pressurizer 120, the inlet control valve V1 and the outlet control valve V2 may be closed to trap the liquid into the liquid pressurizer 120. Thereafter, the pressure of the liquid may be adjusted using the positive pressure or/and the negative pressure provided from the compressor 130 or the like. A first drain line 103 and a first drain valve V3 installed in the first drain line 103 may be connected to the liquid pressurizer 120. After gas dissolved in the liquid is generated by the negative or positive pressure in the liquid pressurizer 120 as a gas bubble, the first drain line 103 may provide a discharge path for discharging the generated gas bubble externally. In more detail, in a state in which the liquid is confined in the liquid pressurizer 120 by closing the inlet control valve V1 and the outlet control valve V2, the negative pressure may be maintained by the compressor 130 for several seconds to reduce the pressure of the liquid. In this case, as illustrated in FIG. 2, a dissolved gas concentration of the liquid may be lowered by the negative pressure, such that the gas dissolved in the liquid may be formed as a gas bubble. In this case, as illustrated in FIG. 3, a constant negative pressure may be provided, and as illustrated in FIG. 4, high negative pressure/low negative pressure, negative pressure/atmospheric pressure, or negative pressure/positive pressure may be alternately provided as pulse-type pressure. As illustrated in FIG. 4, when high negative pressure/low negative pressure, negative pressure/atmospheric pressure, or negative pressure/positive pressure is provided alternately as pulse-type pressure, a gas bubble may be generated due to a change in pressure according to Henry's law. Since a generated gas bubble is not easily dissolved in the liquid, the generated gas bubble may be discharged externally through the first drain line 103 (FIG. 1). When the generated gas bubble is discharged through the first drain line 103, the first drain valve V3 may be opened while the inlet control valve V1 and the outlet control valve V2 are closed. Therefore, liquid having a low dissolved gas concentration remaining in the liquid pressurizer 120 may be supplied to the pump 140. As an example, the first drain line 103 may be connected to the inlet line 101*a*. The present disclosure is not limited thereto, and the first drain line 103 may be connected to a separate gas bubble outlet provided in the liquid pressurizer 120.

The compressor 130 may be connected to the liquid pressurizer 120. The compressor 130 may provide positive pressure or negative pressure to the liquid pressurizer 120 such that the liquid pressurizer 120 may adjust pressure of liquid.

The pump 140 may provide a driving force for moving liquid. The pump 140 may be connected to the semiconductor equipment 10 through a third line 104, a supply valve V4, a fourth line 105, or the like. The pump 140 may supply or drive liquid introduced from the liquid pressurizer 120 to the semiconductor equipment 10 or the like. The pump 140 may be provided with a filter 142 configured to collect or filter an impurity, such as a foreign substance or the like contained in the liquid. The filter 142 may be formed of a porous material, and a size of a pore may be 2 nm or less due to a reduction in size of impurities to be recently managed. In this manner, as the size of the pore decreases, moisture absorption of the liquid in the filter 142 may not be well performed. In this case, a gas bubble collected in the filter 142 may be generated, resulting in product defects due to the gas bubble.

Since liquid having a low dissolved gas concentration is supplied to the pump 140 by the liquid pressurizer 120, moisture absorption of the liquid into the filter 142 may be facilitated. In particular, even when the size of the pore is reduced to 2 nm or less, the liquid may permeate between micropores. In addition, since pressure of liquid supplied at negative pressure is supplied to the filter 142 and the pressure increases to have positive pressure, a fine gas bubble remaining in the pore in the filter 142 may be dissolved in the liquid and the gas bubble may be discharged. Therefore, moisture absorption of the liquid into the filter 142 may be performed more effectively, and a time period required for the moisture absorption of the liquid into the filter 142 may be shortened.

A pressure sensor (not illustrated) may be provided in the pump 140. And, when additional moisture absorption of liquid is desired in the filter 142, the pump 140 may additionally pressurize liquid to the filter 142 to approximately 80 kPa, and may maintain the same, to increase an effect of permeating the liquid into the filter 142. This may be implemented by receiving pressure information from the pressure sensor of the pump 140 and controlling driving of the pump 140. In addition, a constant pressure may be maintained, to effectuate effective additional moisture absorption without an adverse effect (a side effect). Through this, it is possible to guarantee filtration rate performance of the filter 142 passing the liquid, and it is possible to solve problems caused by poor moisture absorption of the liquid by the filter 142. A second drain line 106 may be connected to the filter 142, and a second drain valve V5 may be installed in the second drain line 106. Therefore, liquid having a low dissolved gas concentration may be supplied to the pump 140 to perform a cleaning operation of the filter 142, and then liquid containing a foreign substance and a gas bubble may be discharged externally through the second drain line 106. For example, during a cleaning operation of the filter 142, the pump 140 may perform the cleaning operation of the filter 142 by allowing liquid to alternately pass through the filter 142 in forward and reverse directions. In this case, the forward direction means a direction in which liquid flows from the liquid pressurizer 120 to the semiconductor equipment 10, and the reverse direction means a direction in which liquid flows from the semiconductor equipment 10 to the liquid pressurizer 120.

The liquid supply system 100 may further include a controller 160, and the liquid supply unit 110, the liquid pressurizer 120, the compressor 130, the pump 140, or the like may be connected by the controller 160.

As described above, since liquid having a low dissolved gas concentration passing through the liquid pressurizer 120 may be supplied to the pump 140 and may be then supplied to the semiconductor equipment 10, occurrence of defects due to a gas bubble may be prevented.

In addition, since liquid having a low dissolved gas concentration that has passed through the liquid pressurizer 120 may be supplied to the pump 140, moisture absorption of the liquid into the filter 142 may be performed.

Furthermore, since liquid having a low dissolved gas concentration that has passed through the liquid pressurizer 120 may be supplied to the filter 142, a cleaning operation of the filter 142 may be performed.

In addition, an additional moisture absorption operation of liquid may be performed on the filter 142 through the liquid pressurizer 120 and the pump 140.

Figure 5:
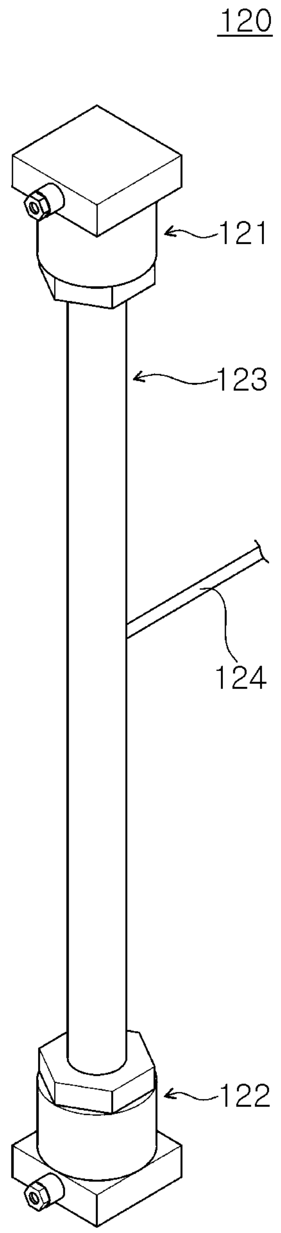
FIG. 5 is a perspective view illustrating a liquid pressurizer according to an example embodiment.
Figure 6:
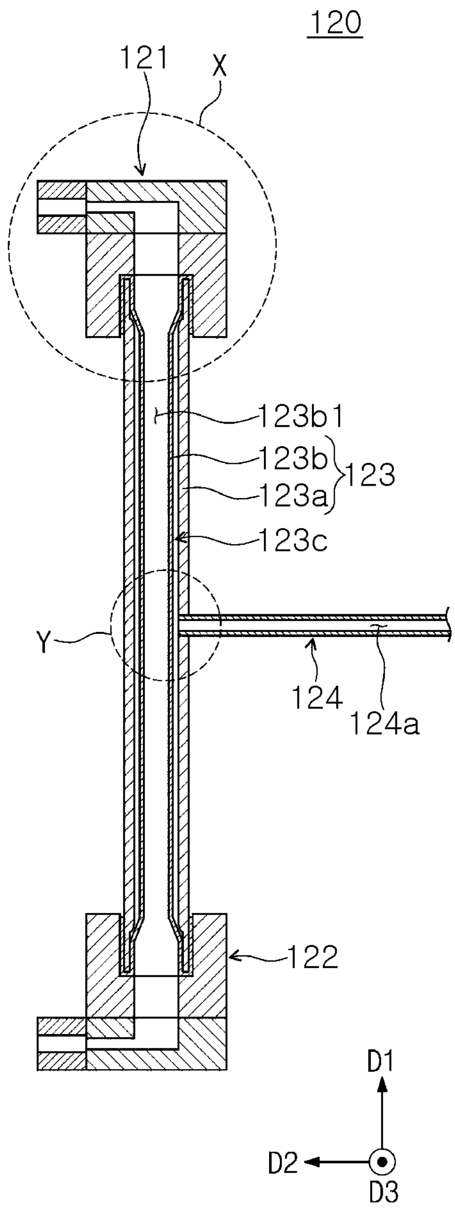
FIG. 6 is a cross-sectional view illustrating a liquid pressurizer according to an example embodiment.
Figure 7A:
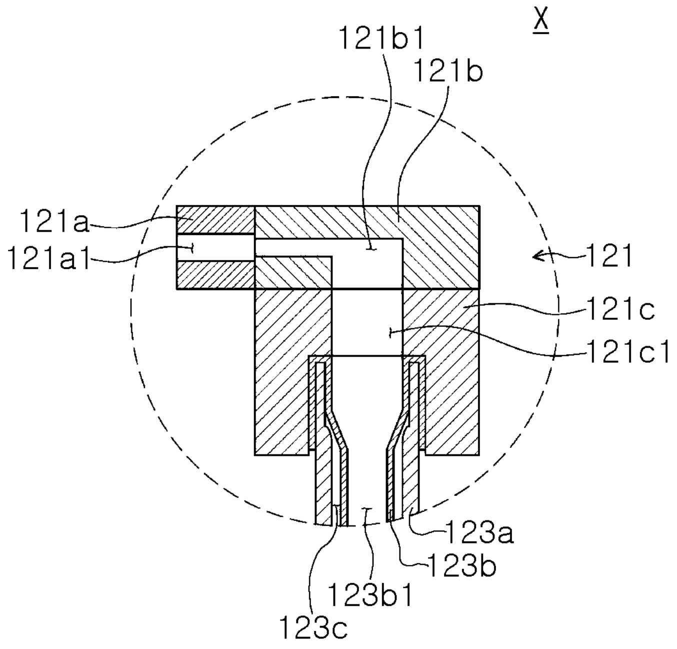
FIGS. 7A to 7C are enlarged cross-sectional views of portions of FIG. 6.
Figure 7B:
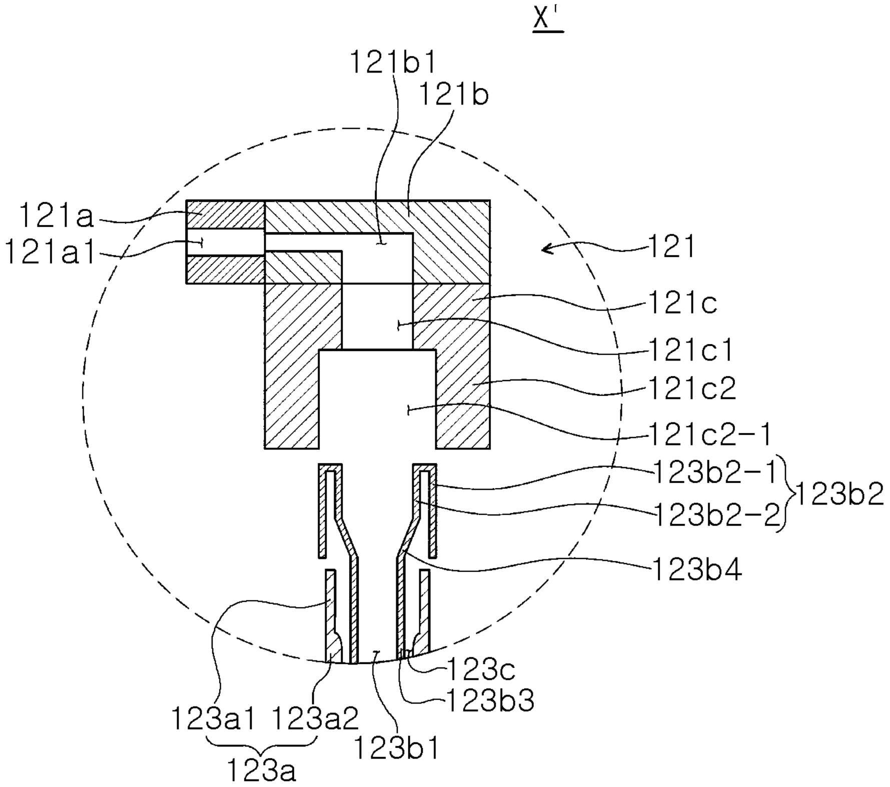
Figure 7C:
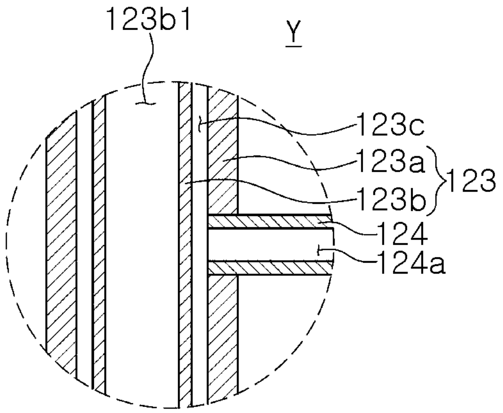

FIG. 5 is a perspective view illustrating a liquid pressurizer according to an example embodiment, FIG. 6 is a cross-sectional view illustrating a liquid pressurizer according to an example embodiment, and FIGS. 7A to 7C are enlarged cross-sectional views of portions of FIG. 6.

Hereinafter, in FIG. 6, D1 will be referred to as a first direction, D2 intersecting the first direction D1 will be referred to as a second direction, and D3 intersecting the first and second directions D1 and D2 will be referred to as a third direction.

Referring to FIG. 5, a liquid pressurizer 120 may include an inlet unit 121, an outlet unit 122, a tube assembly 123, and a pressure control pipe 124.

The inlet unit 121 may be connected to an inlet line 101*a* (as shown in FIG. 1). Therefore, liquid may be introduced into the tube assembly 123 through the inlet unit 121. The outlet unit 122 may be connected to an outlet line 102*a* (as shown in FIG. 1). Thus, the liquid in the tube assembly 123 may flow out through the outlet unit 122. The tube assembly 123 may connect the inlet unit 121 and the outlet unit 122. The pressure control pipe 124 may connect a compressor 130 (as shown in FIG. 1) and the tube assembly 123.

Referring to FIG. 6, a tube assembly 123 may include an outer tube 123*a* and an inner tube 123*b*. The outer tube 123*a* may be on or cover at least a portion of the inner tube 123*b*. For example, a portion of the inner tube 123*b* may be inserted into the outer tube 123*a*. A pressurization space 123*c* may be provided between the outer tube 123*a* and the inner tube 123*b*. The pressurization space 123*c* may be connected to a pressure providing passage 124*a* provided in a pressure control pipe 124. For example, pressure of a compressor 130 (as shown in FIG. 1) may be provided in the pressurization space 123*c* through the pressure providing passage 124*a*. An inner passage 123*b*1 may be provided in the inner tube 123*b*. Liquid supplied from a liquid supply unit 110 (as shown in FIG. 1) may be located in the inner passage 123*b*1. In some embodiments, the outer tube 123*a* and the inner tube 123*b* may include a PFA tube or the like, but are not limited thereto.

Referring to FIG. 7A, the inlet unit 121 may include an inlet 121*a*, a connecting portion 121*b*, and a coupling portion 121*c*. The inlet 121*a* may provide an inlet passage 121*a*1. The inlet passage 121*a*1 may receive liquid from an inlet line 101*a* (as shown in FIG. 1).

A connection passage 121*b*1 of the connecting portion 121*b* may be connected to the inlet passage 121*a*1. The coupling portion 121*c* may be on or cover a portion of the inner tube 123*b* and a portion of the outer tube 123*a*. More specifically, an extension member 121*c*2 (as shown in FIG. 7B) of the coupling portion 121*c* may be on or cover an inlet end portion 123*b*2 of the inner tube 123*b* and an inlet end portion 123*a*1 of the outer tube 123*a*. For example, the inlet end portion 123*b*2 of the inner tube 123*b* and the inlet end portion 123*a*1 of the outer tube 123*a* may be located in an extension hole 123*c*2-1. A coupling passage 121*c*1 of the coupling portion 121*c* may connect the inlet passage 121*a*1 and the inner passage 123*b*1.

Referring to FIG. 7B, the inner tube 123*b* may include a shape deformable tube 123*b*3, a connection tube 123*b*4, and the inlet end portion 123*b*2. The shape deformable tube 123*b*3 may extend in the first direction D1 (as shown in FIG. 6). A shape of the shape deformable tube 123*b*3 may be changed by pressure as described herein. The connection tube 123*b*4 may connect the shape deformable tube 123*b*3 and the inlet end portion 123*b*2. The connection tube 123*b*4 may increase a diameter in an upward direction. The inlet end portion 123*b*2 may be folded outwardly. An outwardly folded portion of the inlet end portion 123*b*2 may be referred to as a folded portion 123*b*2-1, and a non-folded portion of the inlet end portion 123*b*2, located inwardly, may be referred to as an inner portion 123*b*2-2. The folded portion 123*b*2-1 may be on or cover the inlet end portion 123*a*1 of the outer tube 123*a* outwardly. Thus, the inlet end portion 123*a*1 of the outer tube 123*a* may be surrounded by the folded portion 123*b*2-1 and the inner portion 123*b*2-2. The body 123*a*2 of the outer tube 123*a* may extend from the inlet end portion 123*a*1 in a downward direction. According to example embodiments, a portion of the inner tube 123*b* may be folded outwardly to be on or cover a portion of the outer tube 123*a*. Also, the extension member 121*c*2 may be on or cover a portion of the inner tube 123*b* and a portion of the outer tube 123*a*. Therefore, it is possible to reduce or prevent liquid in the inner passage 123*b*1 from leaking externally. Therefore, safety of a semiconductor process may be secured.

Referring to FIG. 7C, the pressurization space 123*c* may be connected to the pressure providing passage 124*a*. For example, pressure of the compressor 130 (as shown in FIG. 1) may be provided to the pressurization space 123*c* through the pressure providing passage 124*a*.

Figure 8:
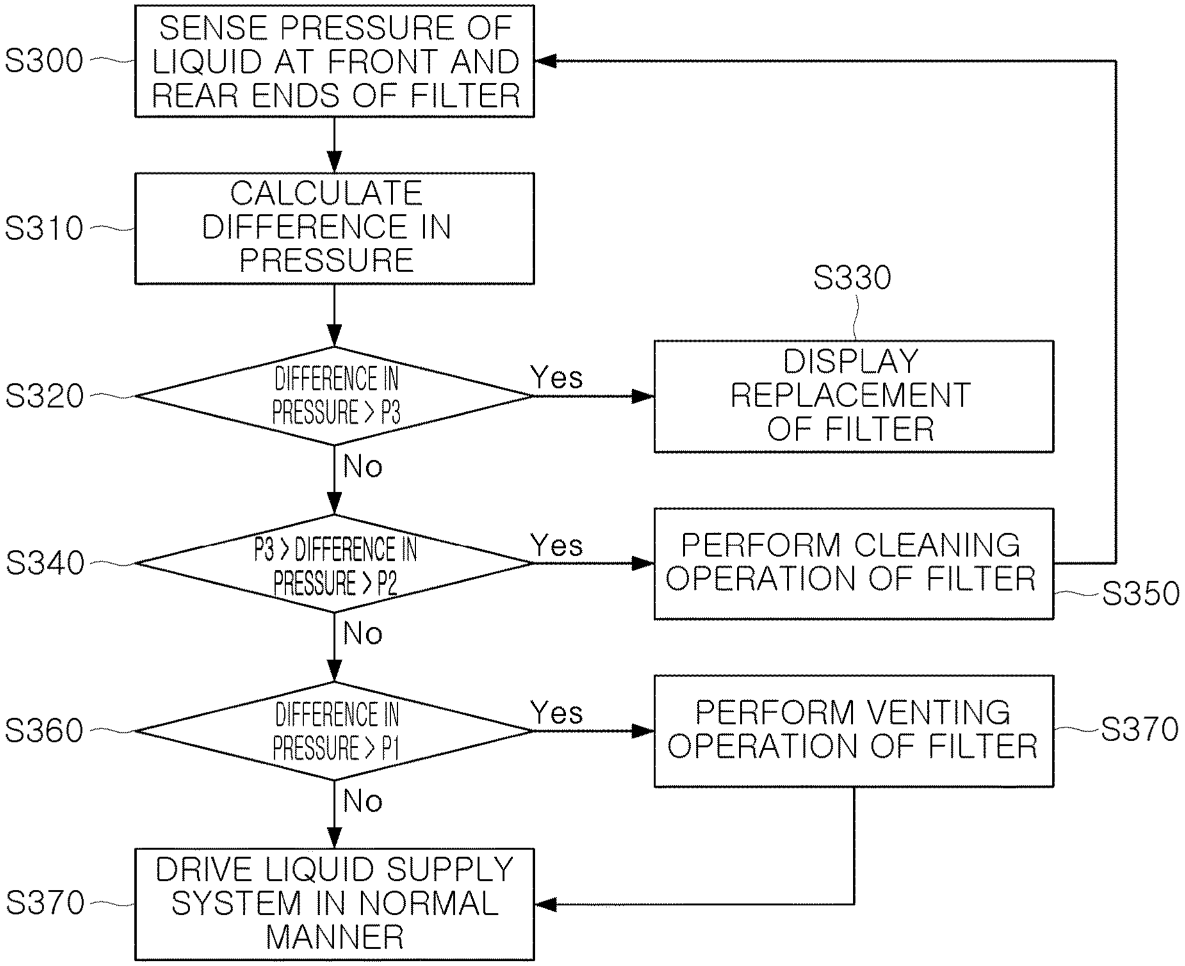
FIG. 8 is a flowchart illustrating a method of driving a liquid supply system according to an example embodiment.

FIG. 8 is a flowchart illustrating a method of driving a liquid supply system according to an example embodiment.

A method of driving a liquid supply system according to an example embodiment to be described below may be a method for performing maintenance, repair, and replacement of a filter 142 (as shown in FIG. 1) provided in a pump 140 (as shown in FIG. 1).

Referring to FIG. 8, pressure of liquid at front and rear ends of a filter 142 may be sensed through a pressure sensor (not illustrated) coupled to a pump 140 (S300).

Thereafter, a controller 160 (as shown in FIG. 1) may calculate a difference between pressure of the liquid at the front end of the filter 142 and pressure of the liquid at the rear end of the filter 142 through a signal from the pressure sensor (S310).

When the difference between pressure of the liquid at the front end of the filter 142 and pressure of the liquid at the rear end of the filter 142 is greater than a preset pressure P3 (S230), the controller 160 may notify and display that the filter 142 needs to be replaced (S330). In this case, an operator may replace the filter 142.

When the difference between pressure of the liquid at the front end of the filter 142 and pressure of the liquid at the rear end of the filter 142 is smaller than the preset pressure P3 but larger than a preset pressure P2 (S340), the controller 160 may perform a cleaning operation of the filter 142 (S350). In the cleaning operation of the filter 142, the controller may control driving of the pump 140 while allowing liquid having a low dissolved gas concentration to be supplied to the pump 140 through a liquid pressurizer 120, to flow the liquid alternately to the filter 142 in forward and reverse directions. In this case, the controller 160 may maintain effective positive pressure in the filter 142 through a signal transmitted through the pressure sensor provided in the pump 140. Therefore, a gas bubble and a foreign substance, adsorbed to the filter 142, may be removed from the filter 142.

When the cleaning operation of the filter is completed, the controller 160 may sense a difference between pressure of the liquid at the front end of the filter 142 and pressure of the liquid at the rear end of the filter 142, and then the difference between pressure of the liquid at the front end of the filter 142 and pressure of the liquid at the rear end of the filter 142 may be calculated.

Moreover, after the cleaning operation of the filter 142 is completed, when the difference between pressure of the liquid at the front end of the filter 142 and pressure of the liquid at the rear end of the filter 142 is lower than a preset pressure P1 (S360), the controller may drive the liquid supply system as described herein, e.g., in a normal manner (S370).

When the difference between pressure of the liquid at the front end of the filter 142 and pressure of the liquid at the rear end of the filter 142 is lower than the preset pressure P2 but higher than the preset pressure P1, the controller 160 may perform a venting operation of the filter by the liquid pressurizer 120, to supply liquid having a low dissolved gas concentration to the pump 140. As such, while the liquid having a low dissolved gas concentration passes through the filter 142, a gas bubble and a foreign substance may be removed from the filter 142. In this case, the liquid from which the gas bubble and the foreign substance are removed from the filter 142 may be discharged externally through a second drain line 106.

Moreover, after the venting operation of the filter is completed, when the difference between pressure of the liquid at the front end of the filter 142 and pressure of the liquid at the rear end of the filter 142 is smaller than a predetermined pressure, e.g., the preset pressure P1, the controller may drive the liquid supply system as described herein.

As described above, since liquid is supplied to semiconductor equipment 10 (as shown in FIG. 1) while the venting operation of the filter 142 and the cleaning operation of the filter 142 are performed, defects caused by a foreign substance and a gas bubble adsorbed on the filter may be reduced.

In addition, since the venting operation of the filter 142 and the cleaning operation of the filter 142 are performed, a lifespan of the filter 142 may increase.

Furthermore, a replacement time point of the filter 142 may be accurately notified, to reduce occurrence of defects due to deterioration of the filter 142.

Figure 9:
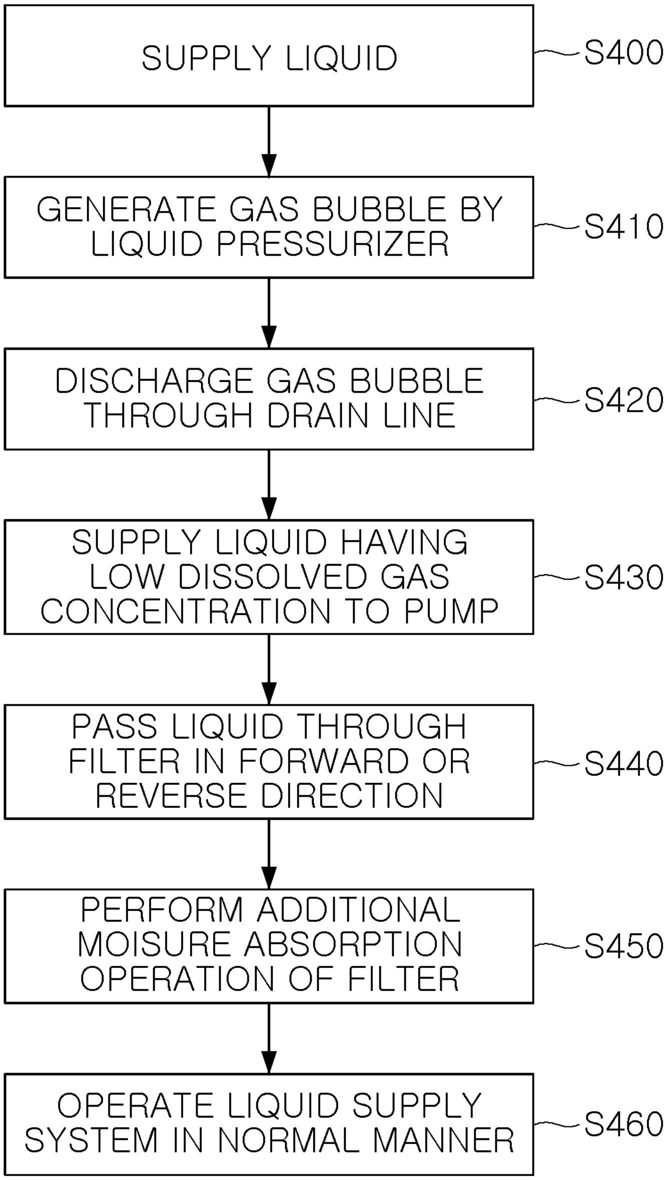
FIG. 9 is a flowchart illustrating a method of driving a liquid supply system according to an example embodiment.

FIG. 9 is a flowchart illustrating a method of driving a liquid supply system according to an example embodiment.

A method of driving a liquid supply system according to an example embodiment to be described below may be a method of replacing a filter 142 (as shown in FIG. 1) provided in a pump 140 (as shown in FIG. 1), and then absorbing moisture from liquid in the filter 142. Referring to FIG. 9, when replacement of a filter 142 is completed, a controller 160 (as shown in FIG. 1) may supply liquid from a liquid supply unit 110 (as shown in FIG. 1) in a direction facing a rear end of the filter 142 (S400).

Thereafter, the controller 160 may generate gas in which the liquid is dissolved into a gas bubble by a liquid pressurizer 120 (as shown in FIG. 1) (S410).

Thereafter, the controller 160 may discharge a generated gas bubble through a first drain line 103 (as shown in FIG. 1) (S420). In this case, a first drain valve V3 (as shown in FIG. 1) may be opened while an inlet control valve V1 (as shown in FIG. 1) and an outlet control valve V2 (as shown in FIG. 1) are closed. Therefore, liquid having a low dissolved gas concentration remaining in the liquid pressurizer 120 may be supplied to a pump 140 (as shown in FIG. 1) (S430).

Thereafter, the controller 160 may allow liquid having a low dissolved gas concentration to pass through the filter 142 of the pump 140 in a forward direction (S440), and may then perform a venting operation of the filter. Therefore, a gas bubble may be removed from the filter 142.

Thereafter, the controller 160 may allow liquid having a low dissolved gas concentration to pass through the filter 142 of the pump 140 in a reverse direction (S440). Thereafter, the controller may repeatedly allow liquid having a low dissolved gas concentration to pass through the filter 142 of the pump 140 in a forward direction, may perform a venting operation of the filter again, and may allow liquid having a low dissolved gas concentration to pass through the filter 142 of the pump 140 in a reverse direction.

Moreover, the controller 160 may allow an additional moisture absorption operation to be performed according to pressure of a pressure sensor provided in the pump 140 (S450). As described above, the additional moisture absorption operation may be an operation of removing a gas bubble in the filter by maintaining effective positive pressure in the filter while monitoring the pressure sensor in the pump 140.

Then, the controller 160 may operate the liquid supply system as described herein, e.g, in a normal manner (S460).

Figure 10:
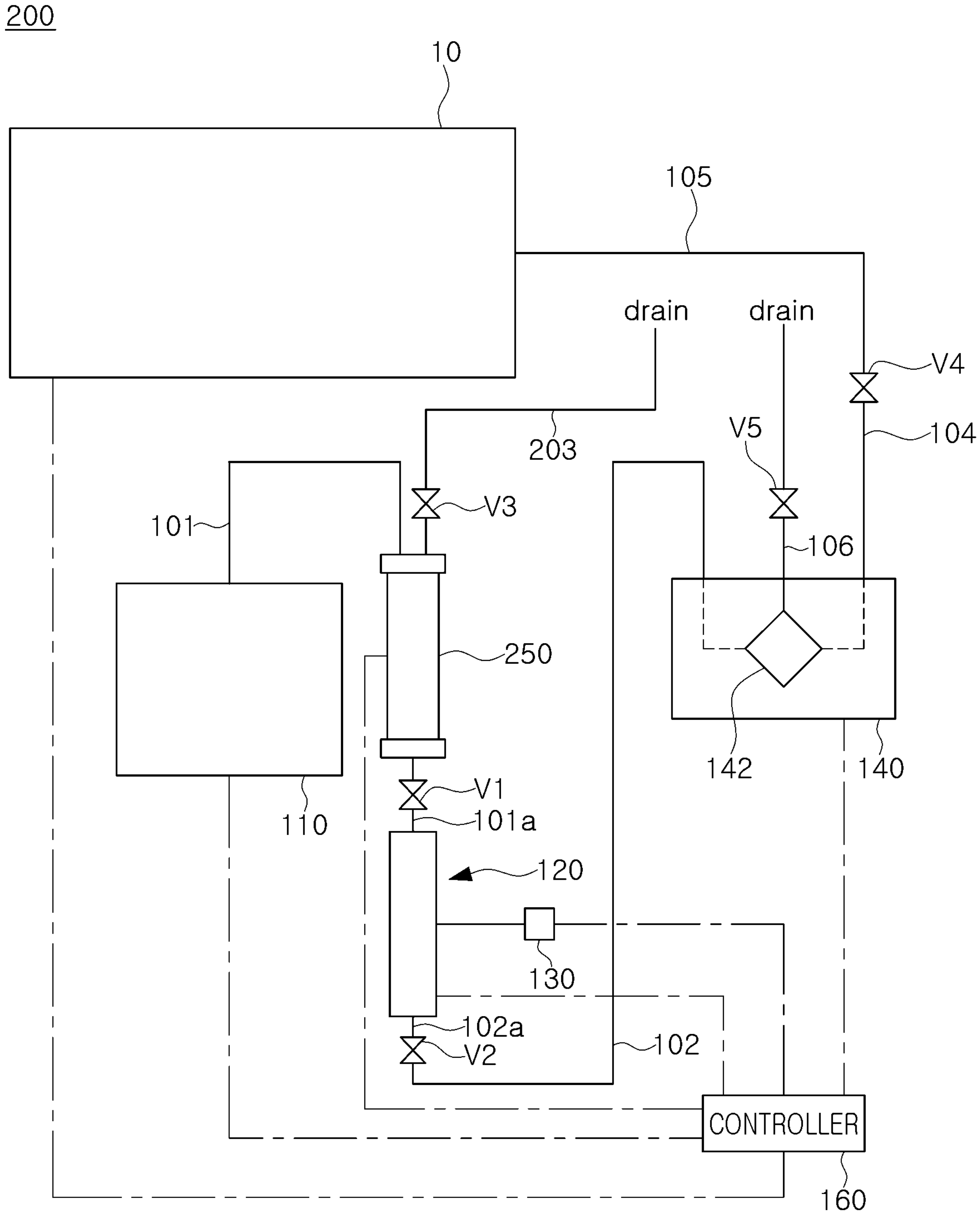
FIG. 10 is a configuration diagram illustrating a liquid supply system according to an example embodiment.

FIG. 10 is a configuration diagram illustrating a liquid supply system according to an example embodiment.

Referring to FIG. 10, a liquid supply system 200 according to an example embodiment may supply liquid or the like to semiconductor equipment 10. The semiconductor equipment 10 may include etching equipment and/or deposition equipment, or the like. The liquid supply system 200 may include a liquid supply unit 110, a liquid pressurizer 120, a compressor 130, a pump 140, a trap tank 250, and the like.

Since the liquid supply unit 110, the liquid pressurizer 120, the compressor 130, and the pump 140 are substantially the same as the components described above, a detailed description thereof will be omitted and the above description will be substituted therewith.

The trap tank 250 may be between the liquid supply unit 110 and the liquid pressurizer 120. Also, the trap tank 250 may serve to temporarily store liquid supplied from the liquid supply unit 110, and then supply the same to the liquid pressurizer 120. Therefore, even when only one liquid reservoir (not illustrated) is provided in the liquid supply unit 110, maintenance, repair, or replacement of the liquid reservoir may be performed. The trap tank 250 may include a first drain line 203 and a first drain valve V3 installed on the first drain line 203. When gas dissolved in the liquid is generated as a gas bubble by negative or positive pressure in the liquid pressurizer 120 and the generated gas bubble is transferred to the trap tank 250, the first drain line 203 may provide a path for discharging the gas bubble externally. Therefore, the drain line may not be connected to the liquid pressurizer 120.

According to an example embodiment, a liquid supply system supplying liquid to a process by removing a gas bubble to maintain cleanliness of the liquid may be provided.

While example embodiments have been illustrated and described above, it will be apparent to those skilled in the art that modifications and variations could be made without departing from the scope of the present inventive concept as defined by the appended claims.

What is claimed is:

1. A liquid supply system comprising:

a liquid supply unit;

a liquid pressurizer connected to the liquid supply unit, the liquid pressurizer comprising an outer tube and an inner deformable tube inserted into the outer tube, wherein a portion of the inner deformable tube extends from an end of the outer tube and the portion of the inner deformable tube is folded over the end of the outer tube;

a first drain line configured between the liquid supply unit and the liquid pressurizer;

a compressor connected to the liquid pressurizer;

a pump connected to the liquid pressurizer and configured to drive a flow of liquid from the liquid pressurizer;

an inflow control valve between the liquid supply unit and the liquid pressurizer; and an outflow control valve between the liquid pressurizer and the pump, wherein the liquid pressurizer and the first drain line are configured to discharge gas bubbles such that the liquid pressurizer is configured to supply liquid having a dissolved gas concentration that is lower than a dissolved gas concentration of liquid supplied from the liquid supply unit.

2. The liquid supply system of claim 1, further comprising a first drain valve in the first drain line, wherein the first drain line is connected to an inlet line between the inflow control valve and the liquid pressurizer.

3. The liquid supply system of claim 1, wherein the compressor is configured to provide constant negative pressure to the liquid pressurizer to generate gas from gas bubbles dissolved in liquid.

4. The liquid supply system of claim 1, wherein the compressor is configured to provide pulse-type pressure to the liquid pressurizer to generate gas from gas bubbles dissolved in liquid.

5. The liquid supply system of claim 1, further comprising a trap tank between the liquid supply unit and the liquid pressurizer.

6. The liquid supply system of claim 5, wherein the first drain line is configured to discharge a gas bubble introduced from the liquid pressurizer that is connected to the trap tank, and a first drain valve is in the first drain line.

7. The liquid supply system of claim 1, wherein a filter configured to remove gas bubbles and impurities from supplied liquid is provided in the pump.

8. The liquid supply system of claim 7, wherein a second drain line configured to discharge liquid containing impurities and gas bubbles is connected to the filter, and a second drain valve is in the second drain line.

9. The liquid supply system of claim 8, wherein the pump is configured to repeatedly drive liquid supplied from the liquid pressurizer to pass through the filter in forward and reverse directions to clean the filter.

10. The liquid supply system of claim 9, wherein liquid used in cleaning of the filter is discharged externally through the second drain line.

11. The liquid supply system of claim 7, wherein the pump is configured to drive liquid through the filter at a pressure that is higher than a pressure of liquid supplied from the liquid pressurizer during a moisture absorption operation in which the liquid is absorbed into the filter.

12. The liquid supply system of claim 1, further comprising a controller configured to control the liquid supply unit, the liquid pressurizer, the compressor, and the pump.

13. The liquid supply system of claim 12, wherein the controller is configured to display a replacement time of a filter in the pump according to a pressure difference between a pressure at a front end of the filter and a pressure at a rear end of the filter.

14. The liquid supply system of claim 13, wherein, when the pressure difference is smaller than a predetermined pressure, the controller is configured to drive the pump, to repeatedly flow liquid supplied from the liquid pressurizer in a forward direction and a reverse direction.

15. The liquid supply system of claim 14, wherein, after repeatedly flowing liquid supplied from the liquid pressurizer in a forward direction and a reverse direction, the controller is configured to control the pump to pass the liquid through the filter at a pressure that is higher than a pressure of the liquid supplied from the liquid pressurizer.

16. The liquid supply system of claim 1, wherein the liquid pressurizer comprises:

an inlet configured to flow liquid into the liquid pressurizer;

an outlet configured to discharge liquid from the liquid pressurizer;

a tube assembly connecting the inlet and the outlet; and a pressure control tube connected to the tube assembly, wherein the tube assembly includes:

an outer tube; and the inner deformable tube inserted into the outer tube, wherein a pressurization space is provided between the outer tube and the inner deformable tube, and a pressure providing passage provided in the pressure control tube is connected to the pressurization space.

17. A liquid supply system comprising:

a liquid supply unit;

a liquid pressurizer configured to receive liquid from the liquid supply unit, the liquid pressurizer comprising an outer tube and an inner deformable tube inserted into the outer tube, wherein a portion of the inner deformable tube extends from an end of the outer tube and the portion of the inner deformable tube is folded over the end of the outer tube;

a first drain line configured between the liquid supply unit and the liquid pressurizer;

a compressor configured to control a pressure of liquid in the liquid pressurizer;

a pump connected to the liquid pressurizer and configured to control a flow of liquid from the liquid pressurizer, wherein the pump comprises a filter configured to remove gas bubbles or impurities from liquid in the pump;

an inflow control valve between the liquid supply unit and the liquid pressurizer; and an outflow control valve between the liquid pressurizer and the pump, wherein the liquid pressurizer and the first drain line are configured to discharge gas bubbles such that the liquid pressurizer is configured to supply liquid having a dissolved gas concentration that is lower than a dissolved gas concentration of liquid supplied from the liquid supply unit; and wherein the pump is configured to pass liquid through the filter at a pressure that is higher than a pressure of liquid supplied from the liquid pressurizer to the pump such that liquid is absorbed into the filter to thereby remove a gas bubble or impurities from liquid supplied from the liquid pressurizer.

18. The liquid supply system of claim 17, further comprising a first drain valve in the first drain line, wherein a first drain line is connected to an inlet line between the inflow control valve and the liquid pressurizer.

19. The liquid supply system of claim 17, wherein the compressor is configured to provide constant negative pressure to the liquid pressurizer to generate gas from gas bubbles dissolved in liquid.

20. The liquid supply system of claim 17, wherein the compressor is configured to provide pulse-type pressure to the liquid pressurizer to generate gas from gas bubbles dissolved in liquid.

* * * * *